United States Patent
Asenov et al.

(10) Patent No.: US 9,373,684 B2
(45) Date of Patent: *Jun. 21, 2016

(54) METHOD OF MANUFACTURING VARIATION RESISTANT METAL-OXIDE-SEMICONDUCTOR FIELD EFFECT TRANSISTOR (MOSFET)

(75) Inventors: Asen Asenov, Glasgow (GB); Gareth Roy, Glasgow (GB)

(73) Assignee: SemiWise Limited, Glasgow, Scottland (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/424,745

(22) Filed: Mar. 20, 2012

(65) Prior Publication Data
US 2013/0249021 A1    Sep. 26, 2013

(51) Int. Cl.
| | |
|---|---|
| H01L 21/336 | (2006.01) |
| H01L 21/8234 | (2006.01) |
| H01L 29/10 | (2006.01) |
| H01L 29/51 | (2006.01) |
| H01L 29/78 | (2006.01) |
| H01L 29/66 | (2006.01) |

(52) U.S. Cl.
CPC ............ *H01L 29/105* (2013.01); *H01L 29/517* (2013.01); *H01L 29/6659* (2013.01); *H01L 29/66545* (2013.01); *H01L 29/66651* (2013.01); *H01L 29/7833* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 5,298,452 A | 3/1994 | Meyerson | |
| 5,314,547 A | 5/1994 | Heremans et al. | |
| 5,316,958 A | 5/1994 | Meyerson | |
| 6,180,978 B1 * | 1/2001 | Chatterjee et al. | ............ 257/327 |

(Continued)

FOREIGN PATENT DOCUMENTS

| | | |
|---|---|---|
| EP | 0936676 | 8/1999 |
| WO | WO-2009/053327 | 4/2009 |
| WO | WO-2013/027092 | 2/2013 |

OTHER PUBLICATIONS

"International Search Report and Written Opinion of the International Searching Authority Dated Nov. 9, 2012, International Application No. PCT/IB2012/001068", (Nov. 9, 2012).

(Continued)

*Primary Examiner* — Mohammad Islam
*Assistant Examiner* — Jay C Chang
(74) *Attorney, Agent, or Firm* — Blakely Sokoloff Taylor & Zafman LLP

(57) ABSTRACT

Variation resistant metal-oxide-semiconductor field effect transistors (MOSFET) are manufactured using a high-K, metal-gate 'channel-last' process. Between spacers formed over a well area having separate drain and source areas, a cavity is formed. Thereafter an ion implant step through the cavity results in a localized increase in well-doping directly beneath the cavity. The implant is activated by a microsecond annealing which causes minimum dopant diffusion. Within the cavity a recess into the well area is formed in which an active region is formed using an un-doped or lightly doped epitaxial layer. A high-K dielectric stack is formed over the lightly doped epitaxial layer, over which a metal gate is formed within the cavity boundaries. In one embodiment of the invention a cap of poly-silicon or amorphous silicon is added on top of the metal gate.

20 Claims, 9 Drawing Sheets

(56) References Cited

U.S. PATENT DOCUMENTS

| | | | |
|---|---|---|---|
| 6,479,866 B1 | 11/2002 | Xiang | |
| 6,566,734 B2 | 5/2003 | Sugihara et al. | |
| 6,627,488 B2 | 9/2003 | Lee | |
| 6,630,710 B1 | 10/2003 | Augusto | |
| 6,667,200 B2 | 12/2003 | Sohn et al. | |
| 6,746,924 B1 | 6/2004 | Lee et al. | |
| 6,812,157 B1 | 11/2004 | Gadgil | |
| 7,023,068 B1 | 4/2006 | Hopper et al. | |
| 7,045,407 B2 | 5/2006 | Keating et al. | |
| 7,459,752 B2 | 12/2008 | Doris et al. | |
| 7,589,347 B2 | 9/2009 | Nash et al. | |
| 7,906,413 B2 | 3/2011 | Cardone et al. | |
| 8,273,617 B2 | 9/2012 | Thompson et al. | |
| 8,748,986 B1 | 6/2014 | Shifren et al. | |
| 2001/0009292 A1 | 7/2001 | Nishinohara et al. | |
| 2002/0001930 A1* | 1/2002 | Lee | 438/585 |
| 2002/0029372 A1* | 3/2002 | Lee | 716/19 |
| 2002/0037619 A1* | 3/2002 | Sugihara et al. | 438/289 |
| 2003/0211681 A1 | 11/2003 | Hanafi et al. | |
| 2004/0201063 A1 | 10/2004 | Fukuda | |
| 2004/0206980 A1* | 10/2004 | Cheong et al. | 257/192 |
| 2006/0022270 A1 | 2/2006 | Boyd et al. | |
| 2006/0046399 A1* | 3/2006 | Lindert et al. | 438/282 |
| 2006/0113605 A1 | 6/2006 | Currie | |
| 2008/0001237 A1* | 1/2008 | Chang et al. | 257/411 |
| 2008/0017887 A1 | 1/2008 | Nagata et al. | |
| 2009/0321820 A1* | 12/2009 | Yamakawa | 257/330 |
| 2009/0321849 A1 | 12/2009 | Miyamura et al. | |
| 2010/0237433 A1* | 9/2010 | Zampardi et al. | 257/378 |
| 2011/0073961 A1 | 3/2011 | Dennard et al. | |
| 2011/0074498 A1 | 3/2011 | Thompson et al. | |
| 2011/0212583 A1 | 9/2011 | Neudeck | |
| 2011/0260220 A1* | 10/2011 | Chi et al. | 257/288 |
| 2013/0001706 A1 | 1/2013 | Haran et al. | |

OTHER PUBLICATIONS

"International Search Report and Written Opinion of the International Searching Authority Dated Nov. 9, 2012, International Application No. PCT/IB2012/001069", (Nov. 9, 2012).

Fu, Y., et al., "Subband structure and ionized impurity scattering of the two dimensional electron gas in δdoped field effect transistor", *Journal of Applied Physics*, vol. 78, No. 5, (Sep. 1, 1995), pp. 3504-3510.

Noda, Kenji, et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.

Asenov, Asen, "Random Dopant Threshold Voltage Fluctuations in 50nm Epitaxial Channel MOSFETs: A 3D 'Atomistic' Simulation Study", *ESSDERC '98: 28th Conference on European Solid-State Devices*, Bordeax, France, (Sep. 8-10, 1998), pp. 300-303.

Asenov, Asen, et al., "Suppression of Random Dopant-Induced Threshold Voltage Fluctuations in Sub-0.1-μm MOSFET's with Epitaxial and δ-Doped Channels", *IEEE Transactions on Electron Devices*, vol. 46, No. 8, (Aug. 1999), pp. 1718-1724.

Courtland, Rachel, "Start-up Seeks New Life for Planar Transistors, SuVolta is pursuing precision doping in its bid to compete with 3-D transistor technology", *ieee spectrum tech alert*, (Dec. 8, 2011), 3 pp. total.

Fujita, K., et al., "Advanced Channel Engineering Achieving Aggressive Reduction of $V_T$ Variation for Ultra-Low-Power Applications", *Electron Devices Meeting (IEDM), 2011 IEEE International*, (Dec. 2011), pp. 32.3.1-32.3.4.

Hokazono, Akira, et al., "25-nm Gate Length nMOSFET With Steep Channel Profiles Utilizing Carbon-Doped Silicon Layers (A P-Type Dopant Confinement Layer)", *IEEE Transactions on Electron Devices*, vol. 58, No. 5, (May 2011), pp. 1302-1310.

Roy, G., et al., "Random dopant fluctuation resistant 'bulk' MOSFETs with epitaxial delta doped channels", *Ultimate Integration in Silicon (ULIS) Conference*, Glasgow, Scotland, (2007), 4 pp. total.

"Notice of Allowance Dated Dec. 19, 2014; U.S. Appl. No. 14/323,177", (Dec. 19, 2014).

"Notice of Allowance Dated Nov. 14, 2014; U.S. Appl. No. 13/424,727", (Nov. 14, 2014).

"Office Action Dated Oct. 24, 2014; U.S. Appl. No. 13/950,868", (Oct. 24, 2014).

"Office Action Dated Oct. 27, 2014; U.S. Appl. No. 13/950,834", (Oct. 27, 2014).

Asenov, Asen, "Random Dopant Induced Threshold Voltage Lowering and Fluctuations in Sub-0.1 μm MOSFETs: A 3-D "Atomistic" Simulation Study", *IEEE Transactions on Electron Devices*, vol. 45, No. 12, (Dec. 1998), pp. 2505-2513.

Saraswat, Krishna C., "Shallow Junctions", downloaded from http://web.stanford.edu/class/ee311/NOTES/ShallowJunctions.pdf, (Apr. 10, 2006), pp. 1-20.

"Office Action Dated Jul. 1, 2015; U.S. Appl. No. 13/950,868", (Jul. 1, 2015).

"Office Action Dated May 15, 2015; U.S. Appl. No. 13/950,810", (May 15, 2015).

"Office Action Dated May 8, 2015; U.S. Appl. No. 14/664,595", (May 8, 2015).

"Office Action Dated Jul. 7, 2014; U.S. Appl. No. 13/950,834", (Jul. 7, 2014).

"Office Action Dated Jul. 8, 2014; U.S. Appl. No. 13/950,810", (Jul. 8, 2014).

"Office Action Dated Jul. 8, 2014; U.S. Appl. No. 13/950,868", (Jul. 8, 2014).

"Office Action Dated Oct. 3, 2014; U.S. Appl. No. 13/950,810", (Oct. 3, 2014).

"Office Action Dated May 7, 2014; U.S. Appl. No. 13/424,727", (May 7, 2014).

"International Search Report and Written Opinion of the International Searching Authority Dated Nov. 13, 2013, International Application No. PCT/IB2013/001637", (Nov. 13, 2013).

"Office Action Dated Nov. 22, 2013; U.S. Appl. No. 13/424,727", (Nov. 22, 2013).

Bruel, M., "Silicon on insulator material technology", *Electronics Letters*, vol. 31, No. 14, (Jul. 6, 1995), pp. 1201-1202.

Colinge, Jean-Pierre, "Hot-Electron Effects in Silicon-on-Insulator n-Channel MOSFET's", *IEEE Transactions on Electron Devices*, vol. ED-34, No. 10, (Oct. 1987), pp. 2173-2177.

Frank, Martin M., "High-k / Metal Gate Innovations Enabling Continued CMOS Scaling", 2011 *Proceedings of the ESSCIRC*, (Sep. 12-16, 2011), pp. 50-58.

Kuhn, Kelin J., et al., "Process Technology Variation", *IEEE Transactions on Election Devices*, vol. 58, No. 8, (Aug. 2011), pp. 2197-2208.

Maleville, Christophe, "Extending planar device roadmap beyond node 20nm through ultra thin body technology", 2011 *International Symposium on VLSI Technology, Systems and Applications (VLSI-TSA)*, (Apr. 25-27, 2011), pp. 1-4.

Markov, Stanislov, et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.

Meyer, J. E., et al., "High Performance, Low Power CMOS Memories Using Silicon-on-Sapphire Technology", 1971 *International Electron Devices Meeting*, (1971), p. 44.

Pawlak, B. J., et al., "Effect of amorphization and carbon co-doping on activation and diffusion of boron in silicon", *Applied Physics Letters*, 89, 062110, (2006), pp. 062110-1 to 062110-3

Pawlak, B. J., et al., "Suppression of phosphorus diffusion by carbon co-implantation", *Applied Physics Letters*, 89, 062102, (2006), pp. 062102-1 to 062102-3.

Takeuchi, Kiyoshi, et al., "Channel Engineering for the Reduction of Random-Dopant-Placement-Induced Threshold Voltage Fluctuation", 1997 *International Electron Devices Meeting (IEDM)*, Technical Digest, (Dec. 7-10, 1997), pp. 841-844.

"Notice of Allowance Dated Dec. 10, 2015; U.S. Appl. No. 14/664,595", (Dec. 10, 2015).

"Notice of Allowance Dated Oct. 5, 2015; U.S. Appl. No. 13/950,810", (Oct. 5, 2015).

"Notice of Allowance Dated Oct. 8, 2015; U.S. Appl. No. 13/950,868", (Oct. 8, 2015).

"Notice of Allowance Dated Jul. 7, 2015; U.S. Appl. No. 13/950,834", (Jul. 7, 2015).

* cited by examiner

METHOD OF MANUFACTURING VARIATION RESISTANT METAL-OXIDE-SEMICONDUCTOR FIELD EFFECT TRANSISTOR (MOSFET)

BACKGROUND OF THE INVENTION

1. Field of the Invention

The present invention generally relates to the manufacturing of metal-oxide-semiconductor field effect transistors (MOSFETs), and more particularly to MOSFETs manufactured for reproducibility of threshold voltages among otherwise identical transistors.

2. Prior Art

Random variation in threshold voltage ($\sigma V_T$) of metal-oxide semiconductor (MOS) field effect transistors (MOSFETs) with high-K (high dielectric constant) metal gate stack is caused by some dominant factors: (i) random dopant fluctuations (RDF) in the well and in the pocket implant regions underneath the gate, which, among other things, cause variations in depletion layer thickness; (ii) line edge roughness (LER) which causes random variation in the length of the gate electrode resulting from random variations in profile of the etched gate; and, (iii) metal gate granularity (MGG) which causes random variations in the local work function due to the grain structure of the gate material. There is a fourth source of variation, the random variations in the effective channel length, referred to as random extension fluctuations (RXF), arising from statistical variations in the position of the junction that separates the channel from either the source or the drain extensions. However, as MOSFETs become smaller, the effects of RDF, LER, and RXF increase and become major factors in determining $\sigma V_T$. The first effect, RDF, has recently gained intense attention. The randomness in the position of the drain extension RXF has two principal sources: a) variations in the final position of implanted ions due to scattering; and, b) variations in the activation and positions of the source/drain extension ions as influenced by the activation and subsequent heat treatments.

It is well-known in the art that as MOSFETs move to finer and finer dimensions, variability of the threshold voltage $\sigma V_T$ seriously undermines the reproducibility of threshold voltages among otherwise identical transistors. This effect is inevitable, and it is particularly severe in its impact on complimentary MOS (CMOS) static random access memories (SRAM), which use millions of near-minimum sized transistors. Development of ultra-thin silicon on insulator (SOI) structures, e.g., fully depleted SOI (FDSOI), and of three-dimensional transistors (FinFET and Tri-Gate), are largely motivated by a need to reduce the threshold spreads $\sigma V_T$ caused by RDF. This trend moves away from the more traditional bulk MOS manufacturing, adversely impacting costs and availability. A cross section 400 of a standard bulk MOSFET, formed in a gate-last process, is shown in FIG. 4. On a bulk 410 of one conductivity type, drain and source areas 420 of an opposite conductivity type are formed. A SiO$_2$ isolation layer 430 is formed over the entire MOSFET transistor, with openings for connections 470 to respective drain and source terminals. In the gate-last process of the MOSFET, the gate is formed by having spacers 440 formed above the SiO$_2$ layer. The SiO$_2$ is removed and typically replaced by a high-K dielectric stack 450 on top of which a metal gate 460 is formed. In certain embodiments the spacers are formed by repeating the deposition-and-etch process.

One method of addressing the RDF problem was described by Asenov et al. in the paper "Suppression of Random Dopant-Induced Threshold Voltage Fluctuations in Sub-0.1-µm MOSFETs with Epitaxial and δ-Doped Channels," IEEE Transactions on Electron Devices, Vol. 46, No. 8, August 1999, Pages 1718-1724. This approach is consistent with bulk transistors, and does not have the same cost penalties associated with FinFETs and FDSOI. This scheme has three key components: a) placing a thin, approximately 10 nanometer (nm), minimally doped epitaxial layer immediately beneath the gate oxide; b) placing a thinner layer with a very high concentration of either acceptors for an NMOS device or donors for a PMOS device at the boundary of the thin epitaxial layer that is remote from the gate dielectric interface; and, c) incorporating a moderately heavily doped well layer beneath the un-doped epitaxial layer and the highly doped, thinner layer. Similar structures have been demonstrated by Fujita et al. as described in their paper "Advanced Channel Engineering Achieving Aggressive Reduction of V$_T$ Variation for Ultra-Low-Power Applications", Electron Devices Meeting (IEDM), 2011 IEEE International, pp. 32.3.1-32.3.4, 5-7 Dec. 2011. A cross section 500 of such an epitaxial transistor is shown in FIG. 5. The epitaxial layer 510 is deposited on the whole silicon wafer after the channel doping implantation through a sacrificial gate oxide and before the formation of the sacrificial polysilicon gate and the source drain regions 525. In some instances, such as Hokazono, A., et al., in "25-nm Gate Length nMOSFET With Steep Channel Profiles Utilizing Carbon-Doped Silicon Layers (A P-Type Dopant Confinement Layer)", Electron Devices, IEEE Transactions on Electron Device, vol. 58, no. 5, pp. 1302-1310, May 2011, carbon is introduced before the epitaxy to arrest the back diffusion of doping into the low-doped epitaxial region during the source/drain implantation activation. However this is an exceedingly difficult task, and experiment has shown that the profiles are degraded due to subsequent processing steps resulting in doping penetration into the low-doped epitaxial layer.

Recent changes to gate architectures from poly-silicon over silicon dioxide or oxynitride, to metal over high-K gate dielectric stack have changed the processing sequence. (A high-K or high dielectric constant as used herein and in the claims to follow means a dielectric constant that is higher than the dielectric constant of silicon dioxide (K=3.9); an effective dielectric constant K exceeding 6 would be a preferred high K.) This is particularly true for the "gate last" process flow. In this process, while there is seemingly a complete transistor, with oxide and/or nitride sidewall spacers on each side of a poly gate, the gate is actually a sacrificial structure. That gate structure and the underlying protective oxide are etched away, exposing the silicon surface. Then a sequence of steps is employed: a) deposition of a high-K gate dielectric, typically by atomic layer deposition; b) deposition of a metal gate having a controlled work function to set the threshold voltage; and, c) deposition of a robust gate material, typically doped amorphous silicon. In many cases the sequence above is augmented by chemical-mechanical polishing steps to assure the localization of the various layers. However, this structure does not overcome the deficiencies resulting from RDF, LER or RXF. The morphology of the metal in the gate last process does reduce the variations identified as MGG, compared to a gate first process.

It would therefore be advantageous to find a solution compatible with bulk MOS manufacturing that would overcome deficiencies resulting from RDF, RXF and LER while generally maintaining the cost advantages and relative simplicity of standard bulk MOS manufacturing. It would be further advantageous if reductions of RDF, RXF, and LER are achieved simultaneously.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Variation resistant metal-oxide-semiconductor field effect transistors (MOSFET) are manufactured using a high-K, metal-gate 'channel-last' process. Between spacers formed over a well area having separate drain and source areas, a cavity is formed. Thereafter an ion implant step through the cavity results in localized increase in well-doping directly beneath the cavity. The implant is activated by a microsecond annealing which causes minimum dopant diffusion. Within the cavity a recess into the well area is formed in which an active region is formed using un-doped or lightly doped epitaxial layer. A high-K dielectric stack is formed over the lightly doped epitaxial layer, over which a metal gate is formed within the cavity boundaries. In one embodiment of the invention a cap of poly-silicon or amorphous silicon is added on top of the metal gate.

According to the principles of the invention, incorporation into the manufacturing process a step of a very lightly doped, low temperature (such as 750° C. or lower, preferably not exceeding 650° C.) epitaxial layer within a cavity formed for the purpose of creation a channel of a MOSFET that results in a "channel-last" process, reduces the diffusion of dopants from the heavily doped region beneath the low-doped epitaxial layer into the low-doped epitaxial layer. The low-doped epitaxial layer reduces the variations in the MOSFETs' threshold voltage arising from random doping fluctuations (RDF). The etching though the opening of the sacrificial poly silicon gate reduces the random channel length fluctuations that arise from variations in the lateral position of the edge of the drain and source extension implants, i.e., random extension fluctuations (RXF). The addition of a layer of increased doping beneath the low doped epitaxial layer reduces the short channel effects and the threshold voltage fluctuations related to line edge roughness (LER). It also offers a method of adjusting the threshold voltage to a desired value. In the descriptive paragraphs below, the heavily doped region will in fact be formed by ion implantation.

Figure 1:
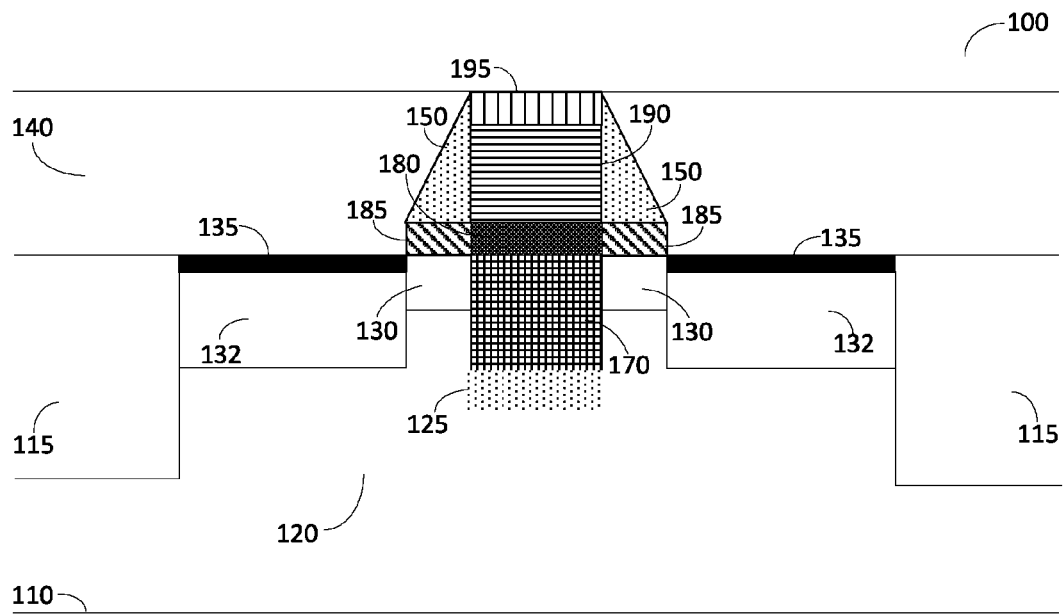
FIG. 1 is a schematic cross-section of a MOSFET manufactured in accordance with the principles of the invention.

Reference is now made to FIG. 1 that depicts an exemplary and non-limiting schematic cross section of a MOSFET 100 manufactured in accordance with the principles of the invention. A well 120 is manufactured in a substrate 110, for example a silicon wafer, the well made of silicon or silicon-germanium, and typically doped to $10^{18}$ to $10^{19}$ ions per $cm^3$. The well may be a P-well or an N-well depending on the desired transistor type, N-channel or P-channel respectively. A silicon-oxide ($SiO_2$) or nitrided silicon dioxide layer 185 provides isolation in surface areas as required for proper operation of the MOSFET 100. Within the well area there are formed source and drain areas that are a combination of a low-doping area 130 and a high-doping area 132, each such source and drain area being separated from the other by a sacrificial polysilicon gate 195, though with some diffusion to extend each region slightly under the sacrificial polysilicon gate 195. Each highly doped area 132 has a silicide area 135, used to electrically connect to the source and drain of the formed MOSFET and to reduce the access resistance. Spacers 150, formed in a conventional manner over the low-doped source or drain area 130, are used to define the gate region of the MOSFET, in a process that resembles a 'gate-last' process and as described herein below in greater detail. A shallow trench 115 separates adjacent transistors.

Within the cavity confined by the spacers 150, a recess is formed into the well 120 and a new active region is formed therein, and then completed consistent with the 'gate-last' manufacturing approach is formed therein. The final transistor structure is formed from several layers, the structure of which is unique to the invention. The processing sequence minimizes the thermal exposure of the very steep diffusion gradients implicit in this structure, ensures the low doping concentration in the epitaxial layer, and increases reproducibility of threshold voltages among otherwise identical transistors. In this embodiment, the active channel is comprised of a first highly doped buried layer 125 formed into the well essentially from the bottom of the cavity and into the well 120, and an epitaxial layer 170 that is either un-doped or lightly doped. The epitaxial layer 170 may be also referred to herein as the channel epitaxial layer 170. The highly doped buried layer 125 is doped to concentrations between $5 \times 10^{18}$ ions/cm$^3$ to $10^{20}$ or $10^{21}$ ions/cm$^3$. The lightly doped epitaxial layer has a doping density typically in the range of zero to $10^{17}$ ions/cm$^3$. The thickness of the buried layer 125 is typically between 1 nm and 100 nm, preferably 0.3 or 1 nano meter to 15 nanometers, while the channel epitaxial layer 170 has a thickness of 1 nm to 25 nm, or 5 nm to 15 nm. Over the channel epitaxial layer 170 a high-K dielectric stack 180 is formed having a typical effective oxide thickness ranging between 0.5 nm and 3 nm. On top of the high-K dielectric stack 180 a metal gate 190 is formed having a typical thickness of 40 or 80 to 200 nm. In one embodiment of the invention a polysilicon cap 195 is added as a layer on top of the metal gate 190. A dielectric layer 140 is further used as part of this structure. It should be therefore understood that the invention covers, without limitation, both a full MOSFET structure 100 as described hereinabove as well as a channel region of a MOSFET that is comprised of the layers 125, 170, 180 and 190 and optionally layer 195. Incorporation of the buried layer 125 and particularly channel epitaxial layer 170 in addition with the 'gate-last' structure minimizes the thermal exposure of the very steep diffusion gradients implicit to this structure and hence increases reproducibility of threshold voltages among otherwise identical transistors. It should therefore be understood that the incorporation of layers 125 and 170 results in a "channel-last" MOSFET architecture that provides the benefits discussed herein over the prior art "gate-last" MOSFET architecture.

Figure 2A:
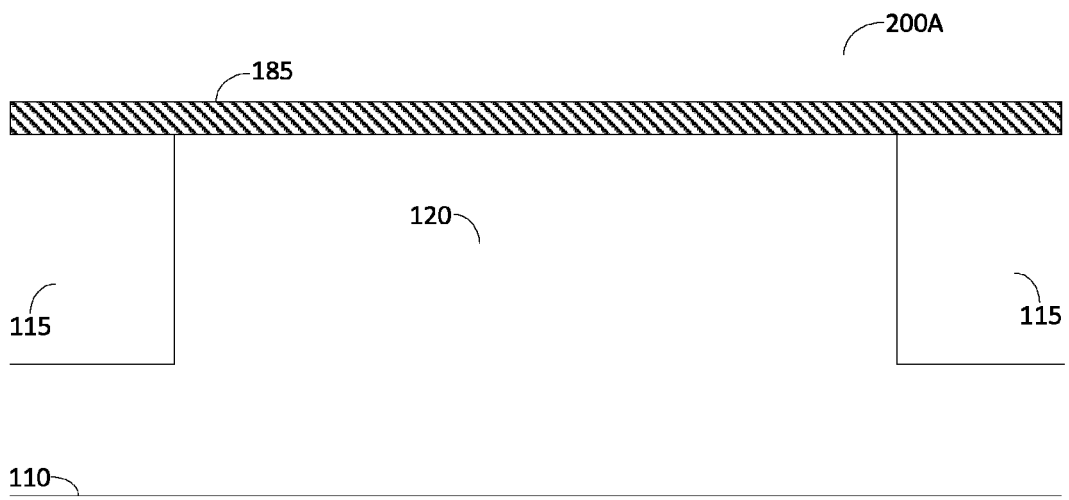
FIG. 2A is schematic cross-section showing a substrate with shallow trench isolation and a properly implanted core well according to an embodiment of the invention.
Figure 2B:
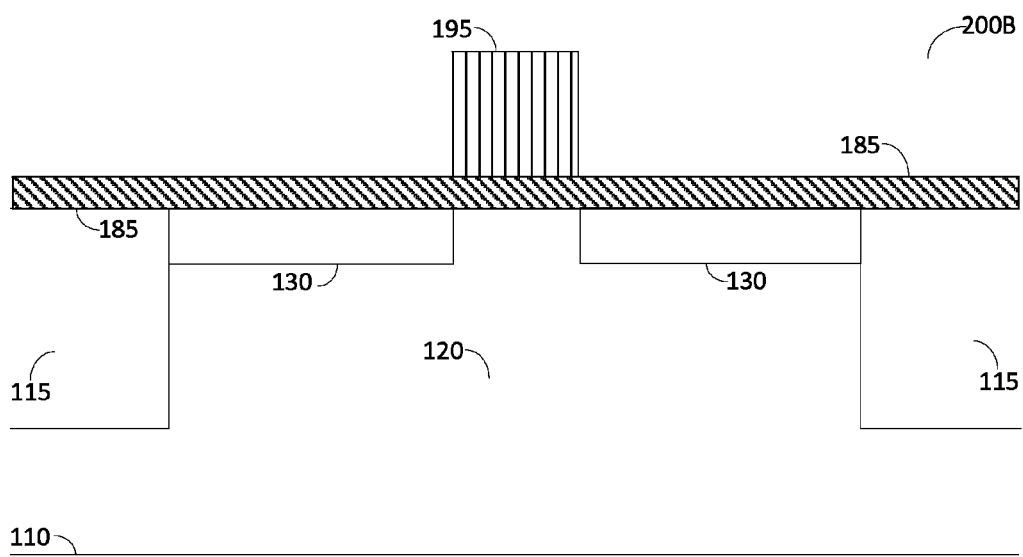
FIG. 2B is a schematic cross-section showing a poly gate and drain/source implants according to an embodiment of the invention.

FIGS. 2A through 2K demonstrate schematically the exemplary and non-limiting processing steps taken in order to achieve the 'channel-last' MOSFET with a channel comprising the two layers one formed by implantation into the well in the channel area and the other formed in a channel recess (also referred to herein as a recess) formed in the well. FIG. 2A shows a cross-section 200A where a substrate 110 is prepared by creating shallow trench isolation 115 and implanting an appropriate well 120 for a desired transistor. A SiO$_2$ or a nitrided SiO$_2$ layer 185 is formed over the entire surface, or in other embodiments on portions thereof, for at least electrical isolation purposes. Such a layer 185 could be of a typical thickness of 3.5 nanometers that may range between 2 nanometers and 8 nanometers, but not limited thereto. In FIG. 2B, cross-section 200B, the formation of a sacrificial poly gate 195 is shown, using appropriate manufacturing masks, for example by deposition and directional etching. Drain and source extension areas 130 are also formed as well as any other pocket implants (not shown) if and when necessary and/or applicable.

Figure 2C:
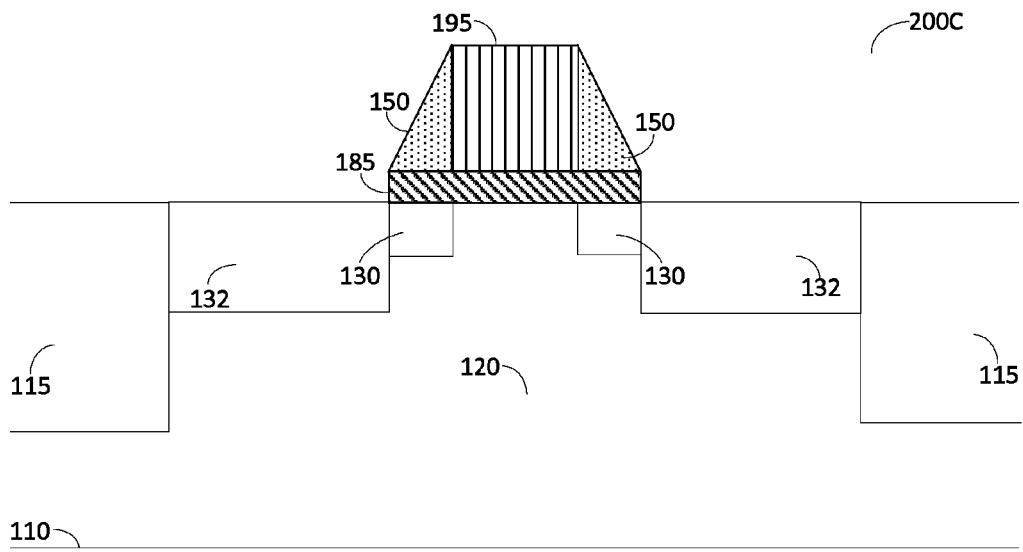
FIG. 2C is a schematic cross-section showing a poly gate spacers and heavy drain/source implants according to an embodiment of the invention.
Figure 2D:
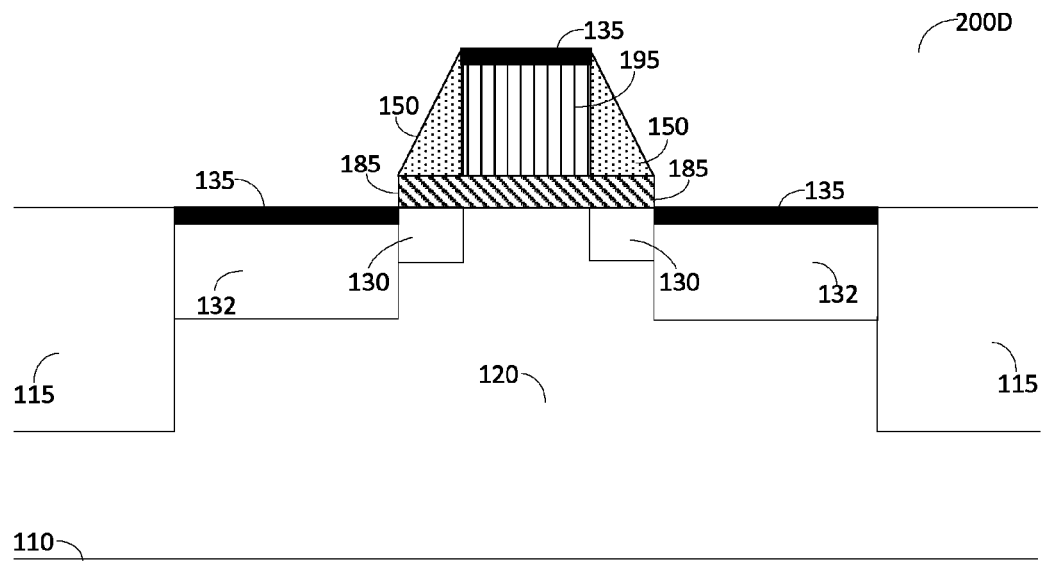
FIG. 2D is a schematic cross-section showing poly gate and drain/source silicidation according to an embodiment of the invention.
Figure 2E:
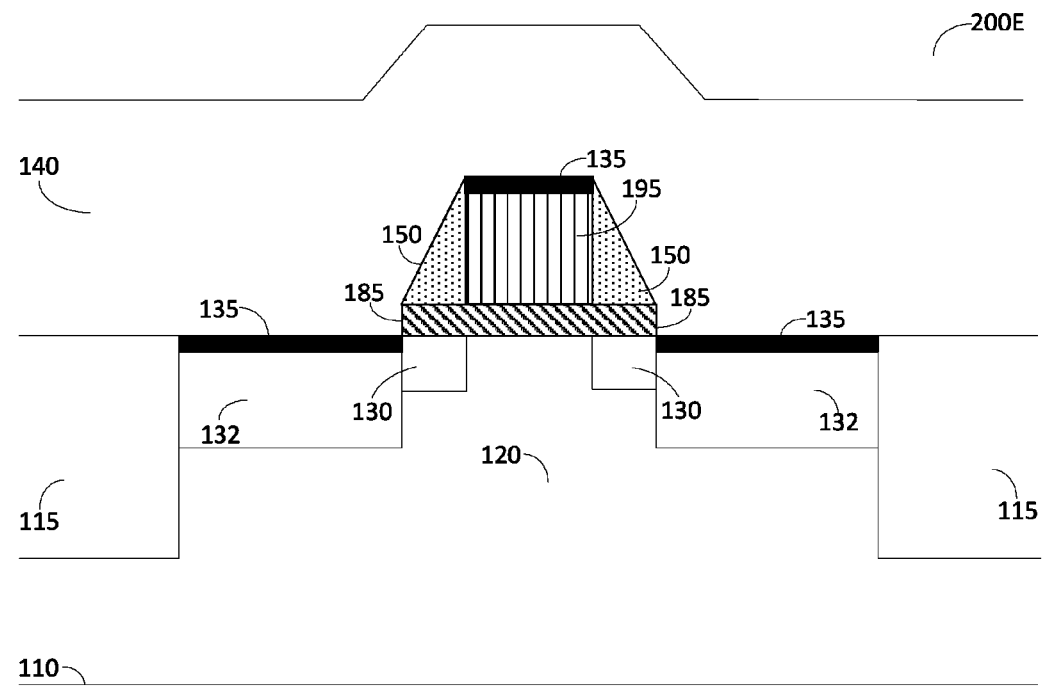
FIG. 2E is a schematic cross-section showing deposition of a first interlayer dielectric according to an embodiment of the invention.
Figure 2F:
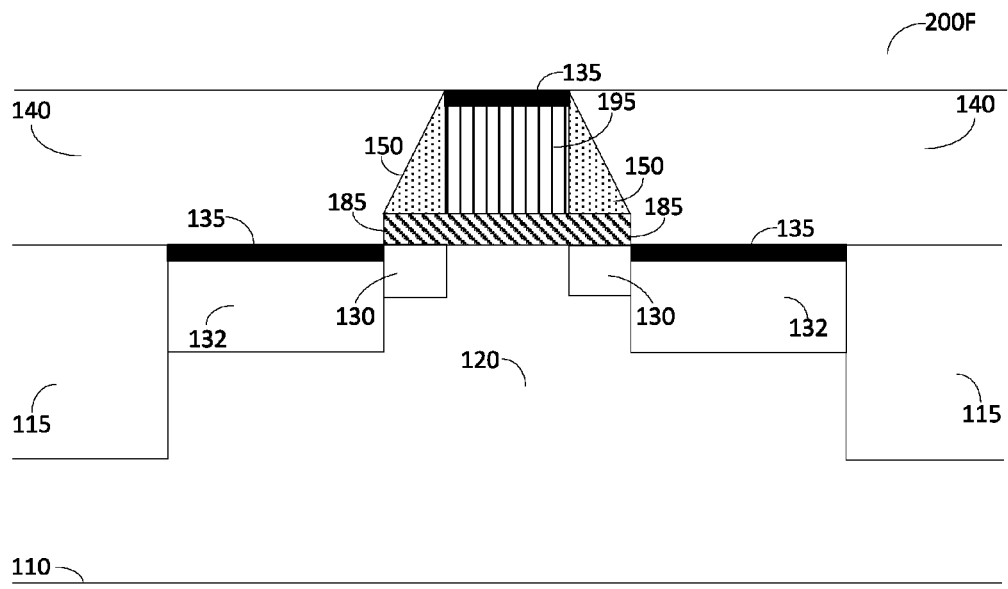
FIG. 2F is a schematic cross-section showing exposed poly gate after chemical/mechanical polish (CMP) according to an embodiment of the invention.

In FIG. 2C the cross-section 200C shows the spacers 150 that are created by deposition of nitride or a combination of nitride and oxide. Then anisotropic etching with vertical or tapered impact takes place. This selectively erodes the deposited sidewall material so the regions paralleling the wafer surface are removed, but vertical or tapered sections remain. In certain embodiments, the spacer is formed by repeating the deposition-and-etch process. After first deposition-and-etch step, the shallow drain/source extensions are formed by ion implantation, plasma immersion doping or a suitable process. Then, another deposition and etch step is carried out to space the drain/source from the channel. After the formation of the spacers 150, the heavily doped source and drain areas 132 can be implanted, typically using the spacers 150 as masks. In some cases (not shown), additional silicon or silicon/germanium may be deposited to elevate the top of the source and drain regions above the original silicon surface and to insert compressive strain in the p-channel MOSFET. Silicon/Germanium (Si:Ge) or Silicon/Carbon (Si:C) stressors, in some cases with a Σ shape, can also be embedded by partial etching of the source and drain regions and epitaxial regrowth of the stressors. In FIG. 2D the cross-section 200D shows the clearing of certain areas of the SiO$_2$ layer 185 to expose for example the drain and source areas 132. It should be noted that the anisotropic etch that forms the spacers 150 may also clear the protective oxide 185. Then a siliciding material is deposited to form a silicide layer 135 in the drain, source and poly areas. Silicidation material may include, but is not limited to nickel, platinum or palladium, which reacts with the intended areas to form a conductive silicide on the gate 195 and the source and the drain areas 132. FIG. 2E shows a cross-section 200E where a first interlayer dielectric 140 is deposited where in FIG. 2F the cross-section 200F shows the result after chemical/mechanical polishing (CMP) of the first interlayer dielectric 140 up to the silicidation layer 135 of the poly gate 195. It should be noted that the silicide layer 135 on the poly gate 195 may or may not be lost by this step. In that regard, it should be noted that all values and ranges provided herein are exemplary only, and should not be considered as limiting the scope of the invention.

Figure 2G:
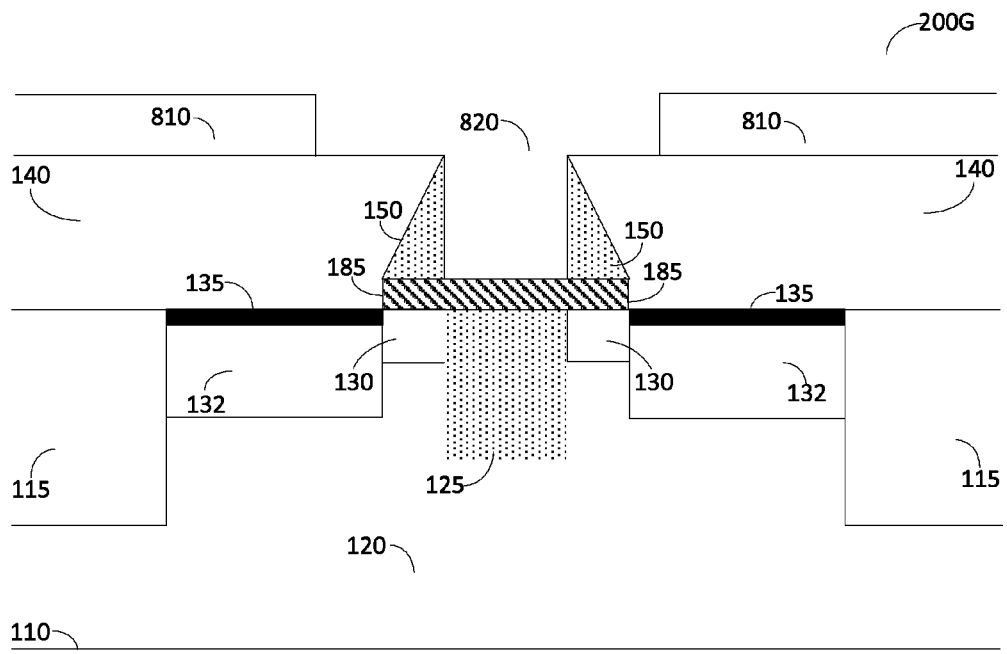
FIG. 2G is a schematic cross-section showing a cavity formed by sacrificing the poly gate and an implant area implanted into the well thereunder according to an embodiment of the invention.

At this point of the process the gates that are to be manufactured using a 'channel-last' process are formed. This is achieved by first coating the area with a protective photoresist 810, and patterning the photoresist as shown in cross-section 200G of FIG. 2G. After patterning, the photoresist protects other devices that are not to be etched. Next, a self-aligned etching process is selected for its selectivity for the sacrificial gate material and its propensity not to etch the spacers 150 and other oxides in any significant manner (FIG. 2G). Then, a cavity 820 is formed in the area confined between the spacers 150 and which is not protected by the protective photoresist layer 810. Any remaining poly gate 195 is etched off as well all the way to the SiO$_2$ layer 185 that is within the cavity 820. Thereafter an implantation step takes place the peak of which is typically targeted to match the depth of the planned channel recess, typically ranging in depth of between, for example, 3 nanometers and 15 nanometers. The enhanced well doping is in the range of $5 \times 10^{18}$ ions/cm$^3$ to $10^{20}$ ions/cm$^3$ and forms buried layer 125 that has a locally increased well doping, i.e., the implant has the same character, donors or acceptors, as that of the well. An activation annealing then takes place, the annealing conditions being constrained by the thermal tolerance of the silicide layers 135. A person of ordinary skill in the art would readily appreciate that FIG. 2G illustrates the use of protective dielectric 185 as a screen oxide for the ion implantation that forms the buried layer 125 of enhanced well doping; the use of a screen oxide being a common industry practice. However, in another embodiment of the invention the process design may be changed to remove the dielectric layer 185 prior to the implant. Such change of sequence should not be viewed as limiting upon the scope of the invention. It should be noted that the implant activation anneal must be completed before growing the un-doped or lightly doped channel epitaxial layer 170 discussed herein below with respect of FIG. 2I.

Figure 2H:
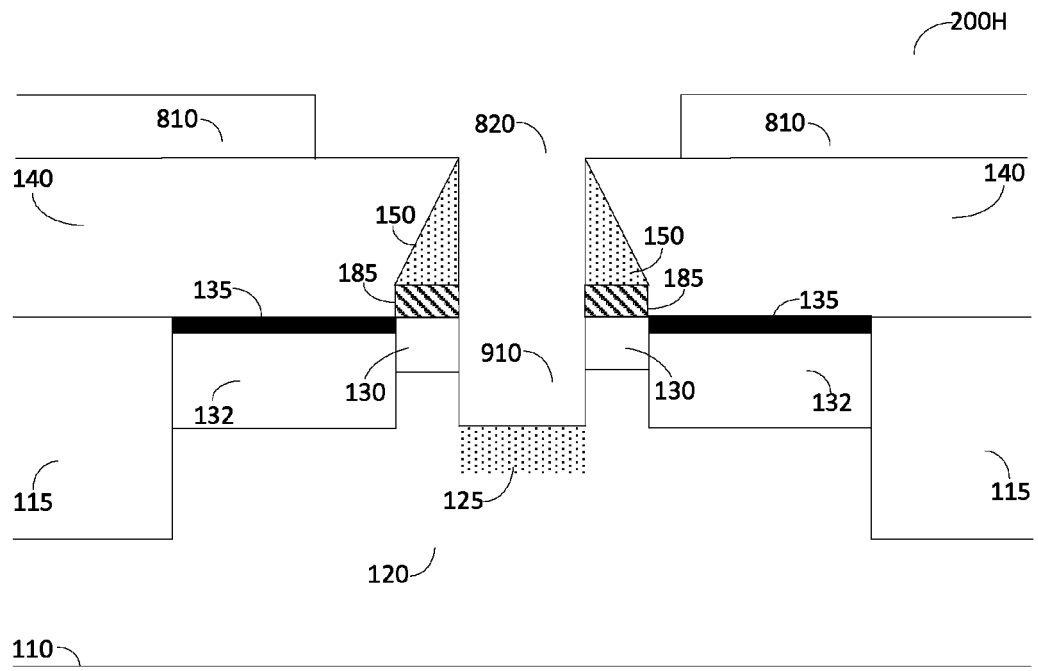
FIG. 2H is a schematic cross section showing a channel recess formed into the buried layer of the well according to an embodiment of this invention.

FIG. 2H shows a cross-section 200H depicting a channel recess 910 that is formed from within the cavity 820 into the highly implanted buried layer 125 of the well 120. This may be done by a processing step where the protective photoresist layer 810 is maintained. A self-aligned, selective etch process may be used to create a 5 to 25 nm recess (or alternatively 3 to 15 nm, or 5 to 20 nm) into the silicon. A person of ordinary skill in the art would readily appreciate that an alternative process sequence might delay the implant that forms the buried layer 125 of enhanced well doping until after the recess 910 has been etched. Such change of sequence should not be viewed as limiting upon the scope of the invention. It should be noted that the implant activation anneal must be completed before growing the un-doped or lightly doped channel epitaxial layer 170 discussed herein below with respect of FIG. 2I. Generally the buried layer and the channel epitaxial layer will be of the same conductivity type as the well.

Figure 2I:
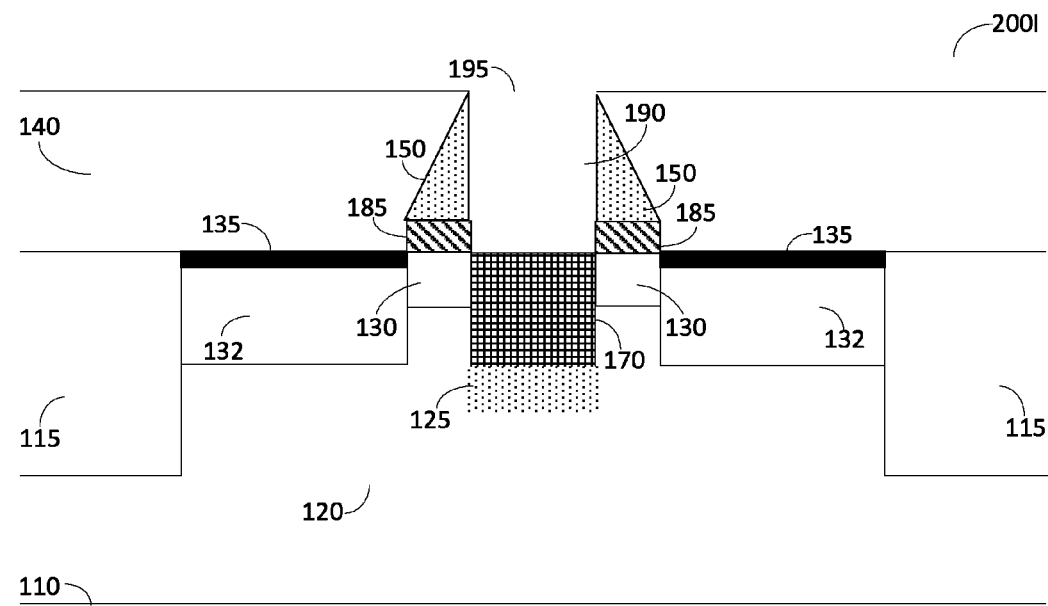
FIG. 2I is a schematic cross-section showing the highly-doped buried layer in the well and a lightly-doped channel epitaxial layer formed within the channel recess according to an embodiment of the invention.

FIG. 2I depicts a cross section 200I of a lightly doped or un-doped channel epitaxial layer 170 grown over the locally enhanced well buried layer 125. This channel epitaxial layer 170 may be formed of silicon, but in certain instances it may be advantageous to grow the low-doped layer using some combination of silicon and germanium, or an alternate semiconducting material that is compatible with the underlying substrate. The thickness of the channel epitaxial layer 170 is controlled such that the top surface of channel epitaxial layer 170 is preferably, but not exclusively, in line with the silicon surface under the layer 185, although the surface of channel layer 170 may be slightly recessed with respect to the lower level of spacer 185. As shown in FIG. 2I, the lower surface of layer 185 coincides with the upper level of channel epitaxial layer 170. The doping density of the enhanced doping buried layer 125 is chosen in combination with the un-doped channel epitaxial layer 170 thickness, the High-K gate stack thickness and the metal gate work function subsequently created to define the final, desired threshold voltage. The formation of channel layer 170 may be performed using atomic layer deposition, low temperature epitaxy or molecular beam epitaxy. Hence, the variation in $\sigma V_T$, for a transistor manufactured at a 32 nm or finer process that would otherwise be in the range of 50-100 mV is reduced to the range of 20-40 mV when the invention is implemented for the same dimension process. As a result, a basically standard bulk MOS manufacturing process may be employed with the invention disclosed herein and without the need to resort to complex solutions suggested by prior art technologies.

A person of ordinary skill in the art would appreciate that the self-aligned etching step that forms recess 910, shown in FIG. 2H, sacrifices any source extension ions or drain extension ions that may have diffused into the channel region. The positions of those ions reflect variations that arise from scattering events during ion implantation and/or from high temperature activation processes (900° C. or higher). The formation of recess 910 eliminates those variations. The use of any one of several low-temperature processes to reconstitute the channel minimizes the movement of the source extension and drain extension ions, substantially eliminating their contribution to RXF. The etching of the overlap portion of the extensions improves the electrostatic integrity, improves the on current and reduces the overlap capacitances.

Figure 3A:
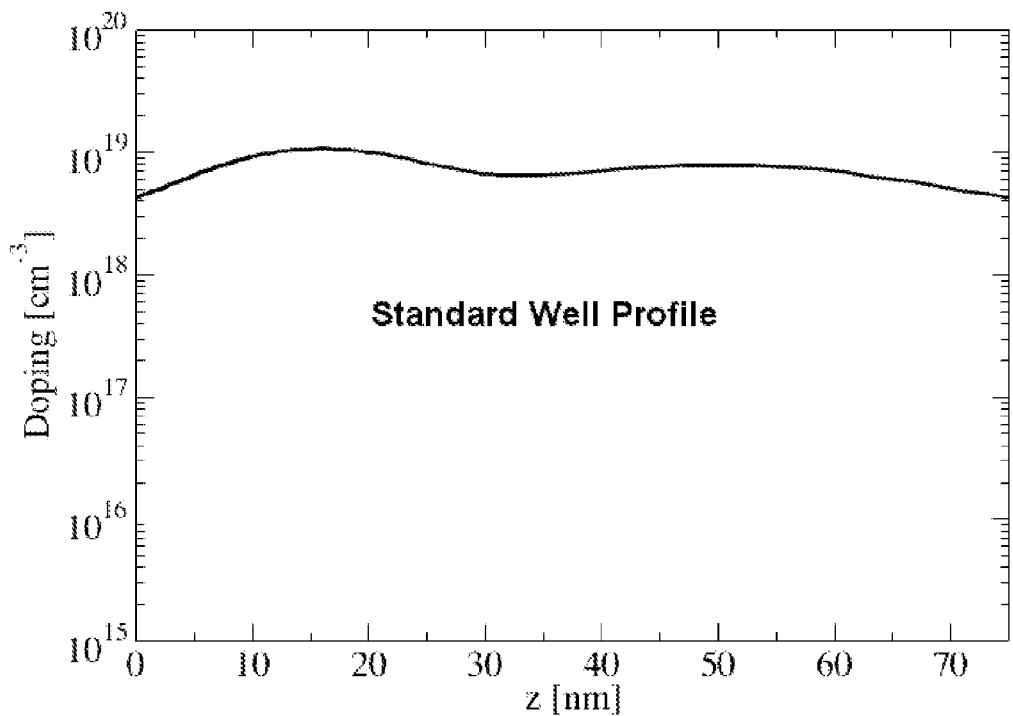
FIG. 3A is a diagram showing a conventional doping profile for short channel transistors.
Figure 3B:
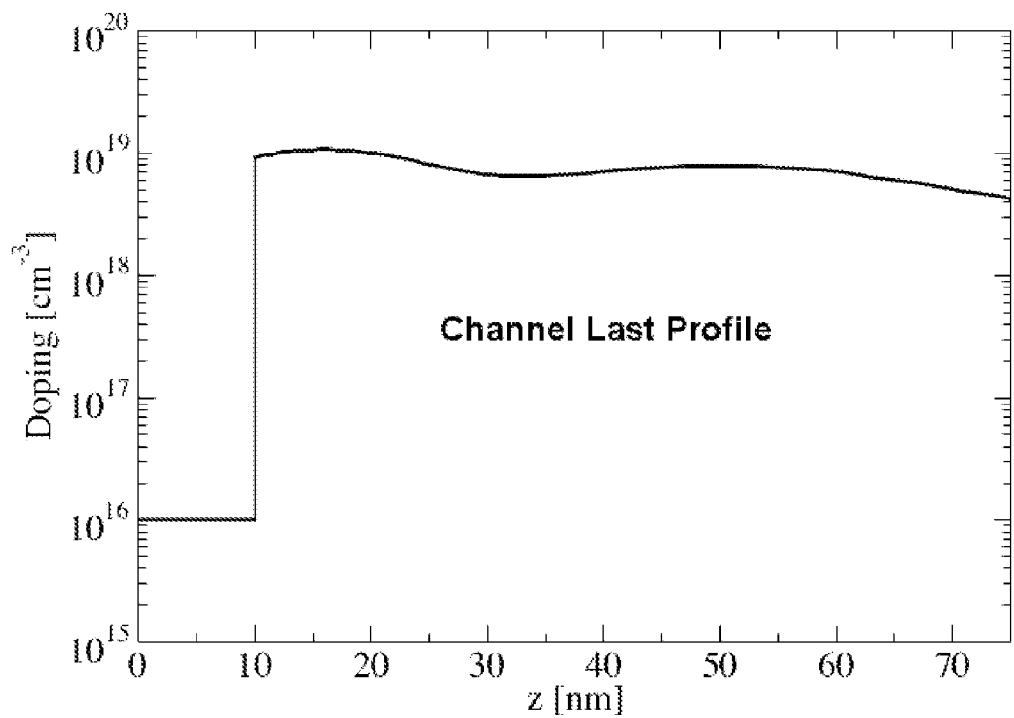
FIG. 3B is a diagram showing a doping profile realized in a channel-last process scheme according to an embodiment of the invention.
Figure 3C:
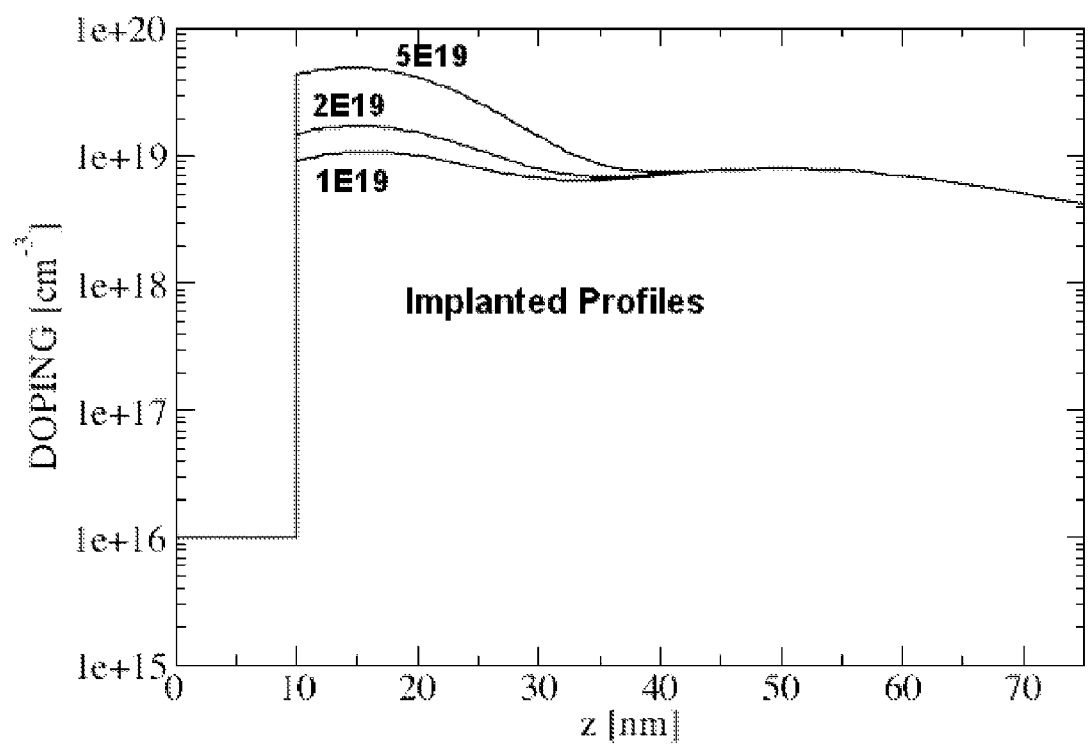
FIG. 3C is a diagram showing ion implanted doping profiles for use in a channel-last process scheme according to an embodiment of the invention.
Figures 4, 5:
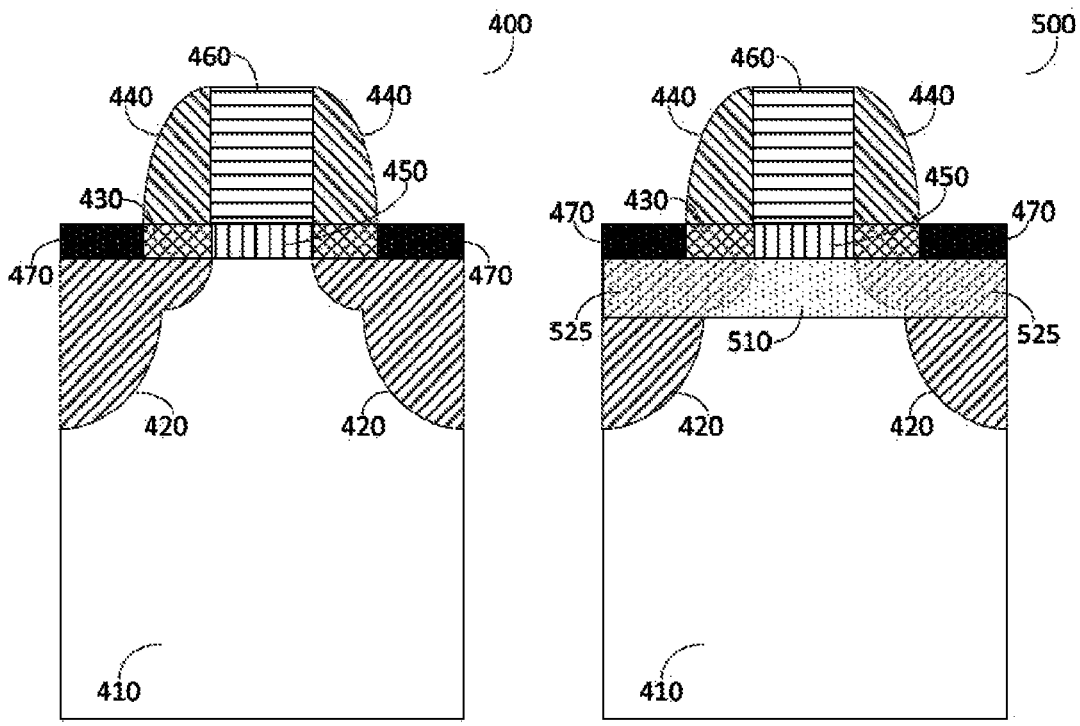
FIG. 4 is a schematic cross section of a standard bulk MOSFET (prior art).
FIG. 5 is a schematic cross section of an epitaxial channel MOSFET (prior art).

Representative doping profiles are illustrated in FIGS. 3A through 3C, where the Z=0 point is at the interface between the high-K dielectric stack 180 and the channel epitaxial layer 170. The region from Z=0 to Z=10 nm represents the nominal thickness of the channel epitaxial layer 170, for reference, taken at the midpoint between the source and drain regions. FIG. 3A shows a channel doping profile that is representative of normal transistor construction. In standard processes, there are multiple implants forming the wells and channel regions of the transistors. The FIG. 3A profile is representative of the middle of the channel, with the combined effect of well implants, threshold voltage implants and pocket implants. The total well depth is typically 200 nm to 400 nm, but the FIG. 3 all show the 75 nm lying closest to the gate. This region is normally highly doped with a shallow "threshold voltage" implant and pocket implants.

FIG. 3B shows the well profile of a simple channel last structure, in which highly doped region nearest the gate has been etched away and replaced with a very low-doped, perhaps un-doped epitaxial layer, illustrated here with a depth of 10 nanometers. FIG. 3C shows a trio of representative doping profiles appropriate to the center of the channel where the well enhancing ions have been implanted and activated. The lowest profile, identified as 1E19 is the same as FIG. 3B, showing the normal well implant profiles. The curves 2E19 and 5E19 show enhanced well implants, implementing the formation of buried layer 125.

Figure 2J:
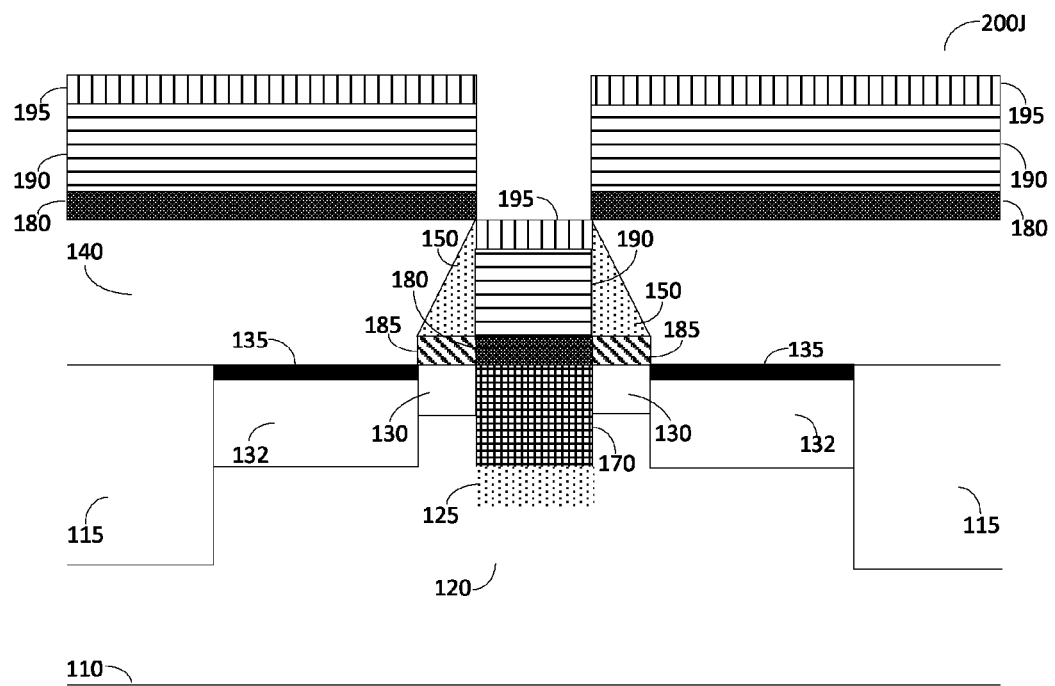
FIG. 2J is a schematic cross-section showing a high-K dielectric layer, a metal gate layer and an optional polysilicon cap formed within the cavity according to an embodiment of the invention.
Figure 2K:
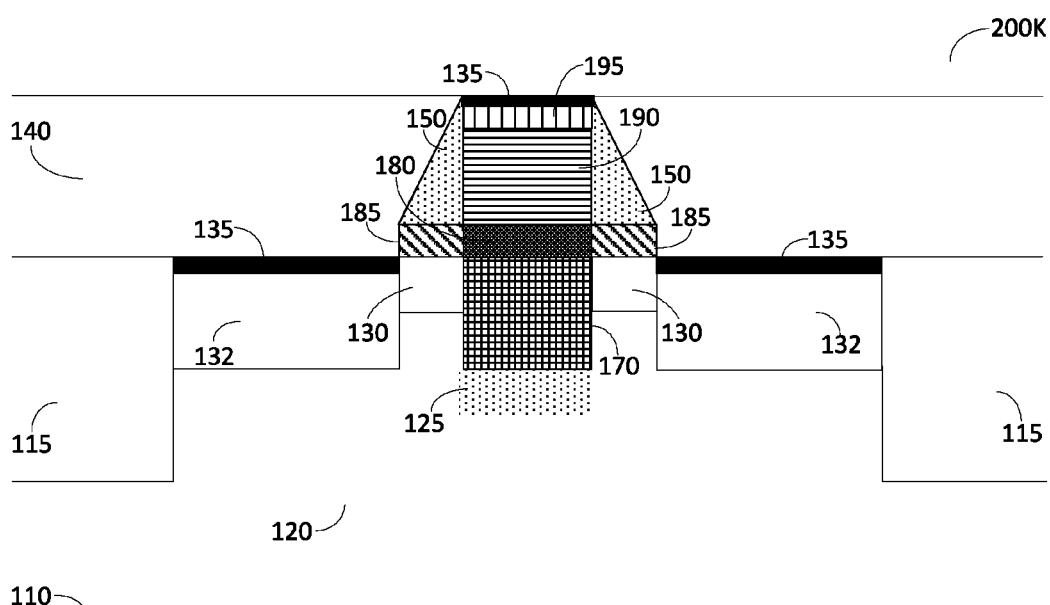
FIG. 2K is a schematic cross-section MOSFET transistor having a gate formed according to an embodiment of the invention.

Following the steps of forming buried layer 125 and channel epitaxial layer 170, and as shown in FIG. 2J, cross-section 200J, a high-K dielectric stack 180 is formed in the cavity 820 over the second channel epitaxial layer 170. This stack may be expected to have an effective dielectric constant K in excess of 6. The high-K dielectric stack 180 consists of a thin layer of $SiO_2$, typically 1 nm or less, capped by a layer of high K dielectric, usually incorporating an oxide or oxynitride of hafnium. All layers after the highly doped buried layer 125 should be formed using a low-temperature (not exceeding 900° C., preferably not exceeding 750° C., and more preferably not exceeding 650° C.) deposition methods. If the present invention is used in an integrated circuit also containing transistors formed by other fabrication techniques, all layers after the highly doped buried layer 125, if used, should be formed after all high temperature operations for the entire integrated circuit have be performed. Thereafter the desired gate metal is deposited forming layer 190, where the gate metal is chosen primarily for its work function as well as for manufacturing considerations. Optionally, a manufacturing process may require a poly-silicon, or amorphous silicon, cap for protection. FIG. 2K shows cross-section 200K that depicts the structure after the removal of the excess high-K dielectric layer 180, metal layer 190 and poly layer 195, using for example CMP. Hereinafter processing may continue by, for example, adding a second dielectric layer (not shown) and thereafter continuing with additional processing steps including, but not limited to, forming metallization connectivity layers. For N and P type MOS transistors different types of metal gate are needed to incorporate work functions appropriate for the desired NMOS and PMOS threshold voltages.

Figure 6:
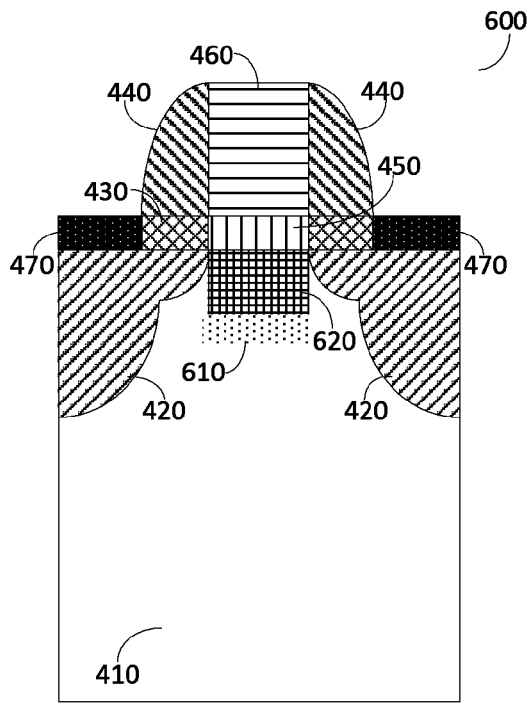
FIG. 6 is a schematic cross section of a channel-last MOSFET further comprising a highly doped, implanted region according to an embodiment of this invention.

FIG. 6 shows a schematic cross section 600 of a channel-last MOSFET according to another embodiment of the invention. Accordingly, the channel region is removed by selective etching between the spacers created by the spacers 440, as explained in further detail hereinabove. A layer 610 is a highly doped, resulting in a localized enhancement of the well implants, carried out either before or after the channel recess is formed and as further explained hereinabove. The region 610 doping must be activated prior to the selective epitaxial growth which creates a low-doped channel region 620. Subsequently the channel is sealed with a high-K dielectric insulator stack 450 and the gate material 460.

Hence it should be understood by those of ordinary skill in the art that an embodiment of the "channel-last" process comprises of the building of the MOSFET's channel in a recess of a cavity etched into the well area between a drain area and a source area of the MOSFET and over a locally enhanced doping area of the well. The channel may comprise of an un-doped or lightly doped epitaxial layer that is grown in the channel recess. Once the channel is created according to the principles of the invention the process is completed similarly to the "gate-last" like processes. It should be further understood that while the process for a "channel-last" solution was described in a manner, where the implant for creation of an enhanced doping in the channel area is performed prior to the creation of the channel recess, other embodiments are possible, including without limitations the creation of the channel recess prior to performing the local enhancement of the doing of the well at the bottom of the channel recess. All such variations to the "channel-last" process should not be considered as departing from the scope of this invention and are hereby included therein.

The invention disclosed herein describes a general well which may be an N-well or a P-well, and hence suitable for a channel of a PMOS or NMOS transistor respectively. Further, the electrostatic characteristics of partially depleted SOI (silicon-on-insulator) transistors are sufficiently similar to bulk semiconductors that all the techniques described in this invention are equally applicable to partially depleted SOI devices. A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to the preferred embodiment, one skilled-in-the-art will readily appreciate that other applications may be substituted for those set forth herein without departing from the spirit and scope of the present invention. Accordingly, the invention should only be limited by the Claims included below.

What is claimed is:

1. A method of manufacture for a fluctuation resistant metal-oxide semiconductor field effect transistor MOSFET, the method comprising:
    forming a poly gate of a first width over a well region and using the poly gate as a mask for forming a first source region and a first drain region having a first doping level and a first depth;
    forming spacers on sides of the poly gate, each of the spacers partially covering the first source region and the first drain region;
    doping the first source region and the first drain region not masked by the spacers to a second doping level that is greater than the first doping level and to a second depth which is greater that the first depth, resulting in formation of a shallow source extension under the respective spacer partially covering the first source region and formation of a shallow drain extension under the respective spacer partially covering the first drain region;
    sacrificing the poly gate to form a cavity of the first width between the spacers;
    etching selectively a recess of a second width equal to the first width into the well region within the cavity through the shallow drain extension and through the shallow source extension, the recess having an implanted buried layer having a thickness of 1 to 100 nanometers at a bottom of the recess, a depth of the recess determined to provide a characteristic of an undoped active channel to be formed therein that reduces statistical variations of threshold voltage ($\sigma V_T$) of the fluctuation resistant metal-oxide semiconductor field effect transistor MOSFET, by either a), etching selectively the recess of a second width equal to the first width into the well region within the cavity and then implanting the buried layer, or b), implanting the buried layer to a depth larger than the depth of the recess to be formed and then etching selectively the recess, leaving the buried layer at the bottom of the recess; and
    forming in the recess the undoped active channel of an undoped channel epitaxial layer touching the shallow source and drain extensions.

2. The method of claim 1, further comprising:
    forming a high-K dielectric stack in the cavity over the channel epitaxial layer; and
    forming a metal gate layer over the high-K dielectric stack in the cavity.

3. The method of claim 2, wherein a thickness of the high-K dielectric stack is between 0.5 nanometers and 3 nanometers.

4. The method of claim 2, wherein a thickness of the metal gate layer is between 40 nanometers and 200 nanometers.

5. The method of claim 1, wherein etching selectively the recess comprises removal of between 5 nanometers and 25 nanometers of the well region material within the cavity.

6. The method of claim 1, wherein forming the active channel comprises using one of: atomic layer deposition, low-temperature epitaxy, or molecular beam epitaxy.

7. The method of claim 1, wherein the buried layer thickness is between 1 nanometer and 15 nanometers.

8. The method of claim 1, wherein the buried layer has a doping level between $5\times10^{18}$ and $10^{21}$ doping ions per cubic centimeter.

9. The method of claim 1, wherein a channel epitaxial layer thickness is between 1 nanometer and 25 nanometers.

10. The method of claim 2, wherein the high-K dielectric stack is one of: a mixed oxide of Hafnium, or a Hafnium oxynitride on a transitional silicon dioxide layer.

11. The method of claim 4, further comprising:
    forming a cap over the metal gate layer in the cavity.

12. The method of claim 11, wherein the cap is made of one of: poly-silicon, or amorphous silicon.

13. The method of claim 1, wherein the implantation of the buried layer is activated before forming the channel epitaxial layer.

14. The method of claim 1, wherein the channel epitaxial layer, and any layer formed thereafter, are all formed using processes not exceeding 900° C.

15. The method of claim 1, wherein the channel epitaxial layer, and any layer formed thereafter, are all formed using processes not exceeding 650° C.

16. The method of claim 1, wherein the fluctuation resistant metal-oxide semiconductor field effect transistor MOSFET is part of an integrated circuit and wherein the integrated circuit is not subjected to a temperature exceeding 900° C. after the channel epitaxial layer is formed.

17. The method of claim 1, wherein the fluctuation resistant metal-oxide semiconductor field effect transistor MOSFET is part of an integrated circuit and wherein the integrated circuit is not subjected to a temperature exceeding 650° C. after the channel epitaxial layer is formed.

18. A method of manufacture for a fluctuation resistant metal-oxide semiconductor field effect transistor MOSFET, the method comprising:
    forming a poly gate having a first width over a well region and using the poly gate as a mask for forming a first source region and a first drain region having a first doping level and a first depth;
    forming spacers on sides of the poly gate, each of the spacers partially covering the first source region and the first drain region;
    doping the first source region and the first drain region not masked by the spacers to a second doping level that is greater than the first doping level and to a second depth which is greater that the first depth to form second source and drain regions, respectively, resulting in formation of a shallow source extension under the respective spacer partially covering the first source region and formation of a shallow drain extension under the respective spacer partially covering the second drain region;

sacrificing the poly gate to form a cavity having the first width between the spacers;

etching selectively a recess of a second width equal to the first width into the well region within the cavity through the shallow drain extension and through the shallow source extension, the recess having an implanted buried layer having a thickness of 1 to 15 nanometers at a bottom of the recess, a depth of the recess determined to provide a characteristic of an undoped active channel to be formed therein that reduces statistical variations of threshold voltage ($\sigma V_T$) of the fluctuation resistant metal-oxide semiconductor field effect transistor MOSFET, by either a) etching selectively the recess of a second width equal to the first width into the well region within the cavity and then implanting the buried layer, or b), implanting the buried layer to a depth larger than the depth of the recess to be formed and then etching selectively the recess, leaving the buried layer at the bottom of the recess; and forming in the recess the undoped active channel formed in an undoped channel epitaxial layer formed from the bottom of the recess over the buried layer and touching the shallow source and drain extensions;

forming a dielectric layer over the undoped channel epitaxial layer; and forming a metal gate layer over the dielectric layer.

19. A method of manufacture for a fluctuation resistant metal-oxide semiconductor field effect transistor MOSFET, the method comprising:

forming a poly gate having a first width over a well region and using the poly gate as a mask for forming a first source region and a first drain region having a first doping level and a first depth;

forming spacers on sides of the poly gate, each of the spacers partially covering the first source region and the first drain region;

doping the first source region and the first drain region not masked by the spacers to a second doping level that is greater than the first doping level and to a second depth which is greater that the first depth to form second source and drain regions, respectively, resulting in formation of a shallow source extension under the respective spacer partially covering the first source region and formation of a shallow drain extension under the respective spacer partially covering the second drain region;

sacrificing the poly gate to form a cavity having the first width between the spacers;

implanting into the bottom of the cavity to form a buried layer, the buried layer having a third depth into the well region;

etching selectively a recess of a second width equal to the first width into the well region within the cavity, through the shallow drain extension and through the shallow source extension, the recess having a bottom surface at a fourth depth that is greater than the first depth, but less than the third depth, the fourth depth of the recess determined to provide a characteristic of an undoped active channel to be formed therein that reduces statistical variations of threshold voltage ($\sigma V_T$) of the fluctuation resistant metal-oxide semiconductor field effect transistor MOSFET;

forming in the recess the undoped active channel within an undoped channel epitaxial layer formed from the bottom surface of the recess over the buried layer and touching the shallow source and drain extensions;

forming a dielectric layer over the undoped channel epitaxial layer; and forming a metal gate layer over the dielectric layer.

20. The method of claim 19, wherein implanting to the third depth into the cavity ensures a thickness of the buried layer of 1 to 15 nanometers below the undoped channel epitaxial layer.

* * * * *